(12) United States Patent
Hwang

(10) Patent No.: US 11,127,620 B2
(45) Date of Patent: Sep. 21, 2021

(54) ELECTROSTATIC CHUCK FOR HIGH TEMPERATURE PROCESSING CHAMBER

(71) Applicant: Applied Materials, Inc., Santa Clara, CA (US)

(72) Inventor: Bernard Lloyd Hwang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 385 days.

(21) Appl. No.: 16/009,423

(22) Filed: Jun. 15, 2018

(65) Prior Publication Data

US 2018/0366361 A1 Dec. 20, 2018

Related U.S. Application Data

(60) Provisional application No. 62/521,873, filed on Jun. 19, 2017.

(51) Int. Cl.
| | |
|---|---|
| *H01L 21/683* | (2006.01) |
| *H01L 21/67* | (2006.01) |
| *H01J 37/32* | (2006.01) |
| *H01L 21/687* | (2006.01) |

(52) U.S. Cl.
CPC ........ *H01L 21/6833* (2013.01); *H01J 37/321* (2013.01); *H01J 37/32715* (2013.01); *H01L 21/67017* (2013.01); *H01L 21/68742* (2013.01)

(58) Field of Classification Search
CPC .......................................... H01L 21/683–6833
See application file for complete search history.

(56) References Cited

U.S. PATENT DOCUMENTS

| | | | |
|---|---|---|---|
| 5,745,332 A | 4/1998 | Burkhart et al. | |
| 5,751,537 A | 5/1998 | Kumar et al. | |
| 5,817,406 A * | 10/1998 | Cheung | C23C 16/4586 428/210 |
| 6,259,592 B1 | 7/2001 | Ono | |
| 6,273,958 B2 | 8/2001 | Shamouilian et al. | |
| 6,639,783 B1 * | 10/2003 | Shamouilian | H02N 13/00 279/128 |
| 7,800,029 B2 * | 9/2010 | Nishioka | H05B 3/143 219/544 |
| 2009/0273878 A1 * | 11/2009 | Lee | H01L 21/6831 361/234 |
| 2010/0039747 A1 * | 2/2010 | Sansoni | H01L 21/6831 361/234 |

(Continued)

*Primary Examiner* — Peter M Novak
(74) *Attorney, Agent, or Firm* — Patterson + Sheridan, LLP

(57) ABSTRACT

Implementations of the present disclosure include methods and apparatuses utilized to reduce cracking of the substrate support surface of a high temperature electrostatic chuck within a processing chamber. In one implementation, a high temperature electrostatic chuck has a ceramic body. The ceramic body has a workpiece mounting surface and a bottom surface. A plurality of backside gas channels are formed in the workpiece mounting surface. A chucking mesh disposed in the ceramic body has a main chucking portion spaced a first distance from the workpiece mounting surface and an electrode mounting portion spaced a second distance from the workpiece mounting surface, wherein the second distance is greater than the first distance. An electrode is coupled the electrode mounting portion and is accessible from the bottom surface.

18 Claims, 3 Drawing Sheets

(56) References Cited

U.S. PATENT DOCUMENTS

2015/0162231 A1* 6/2015 Cox ................. H01L 21/67748
    29/559
2016/0196998 A1* 7/2016 Golda ................ H01L 21/6833
    361/234
2016/0225651 A1* 8/2016 Tran .................. H01L 21/6833

* cited by examiner

ELECTROSTATIC CHUCK FOR HIGH TEMPERATURE PROCESSING CHAMBER

CROSS-REFERENCE TO RELATED APPLICATIONS

This application claims benefit of U.S. Provisional Application Ser. No. 62/521,873, filed Jun. 19, 2017, of which is incorporated by reference in its entirety.

BACKGROUND

Field

Implementations of the present disclosure generally relate to semiconductor processing systems. More specifically, implementations of the disclosure relate to a high temperature electrostatic chuck for use in semiconductor processing systems.

Description of the Related Art

Reliably producing nanometer sized and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development utilize processing at temperatures exceeding 300 degrees Celsius. A substrate support assembly may hold, or chuck, the substrate on an electrostatic chuck (ESC) for processing at these high temperatures. However, conventional ESC used to support the substrates during processing at these high temperatures has experienced undesirable damage on the surface of the ESC necessitating the premature replacement of the ESC.

Thus, there is a need for an improved substrate support assembly having an ESC suitable for use at processing temperatures above 300 degrees Celsius.

SUMMARY

Implementations of the present disclosure include methods and apparatuses utilized to reduce cracking of the substrate support surface of a high temperature electrostatic chuck (HT ESC) within a processing chamber. In one embodiment, a HT ESC has a ceramic body. The ceramic body has a workpiece mounting surface and a bottom surface. A plurality of backside gas channels are formed in the workpiece mounting surface. A chucking mesh is disposed in the ceramic body. The chucking mesh has a main chucking portion spaced a first distance from the workpiece mounting surface and an electrode mounting portion spaced a second distance from the workpiece mounting surface, wherein the second distance is greater than the first distance. An electrode is coupled to the electrode mounting portion and is accessible from the bottom surface.

In another embodiment, a processing chamber has a body and a substrate support assembly disposed within the body. The substrate support assembly has a HT ESC. The HT ESC has a ceramic body. The ceramic body has a workpiece mounting surface and a bottom surface. A plurality of backside gas channels are formed in the workpiece mounting surface. A chucking mesh is disposed in the ceramic body. The chucking mesh has a main chucking portion spaced a first distance from the workpiece mounting surface and an electrode mounting portion spaced a second distance from the workpiece mounting surface, wherein the second distance is greater than the first distance. An electrode is coupled to the electrode mounting portion and is accessible from the bottom surface.

In yet another embodiment, a method for forming a HT ESC is provided. The method begins by sandwiching a chucking mesh between ceramic sheets which are then sintered together to form a ceramic body of the HT ESC. A dimple is formed in the chucking mesh. An electrode is attached to the dimple wherein the electrode is accessible from a bottom surface of the HT ESC and backside gas channels are formed in a workpiece support surface of the ESC, wherein the backside gas channels are misaligned with the electrode.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings.

Figure 1:
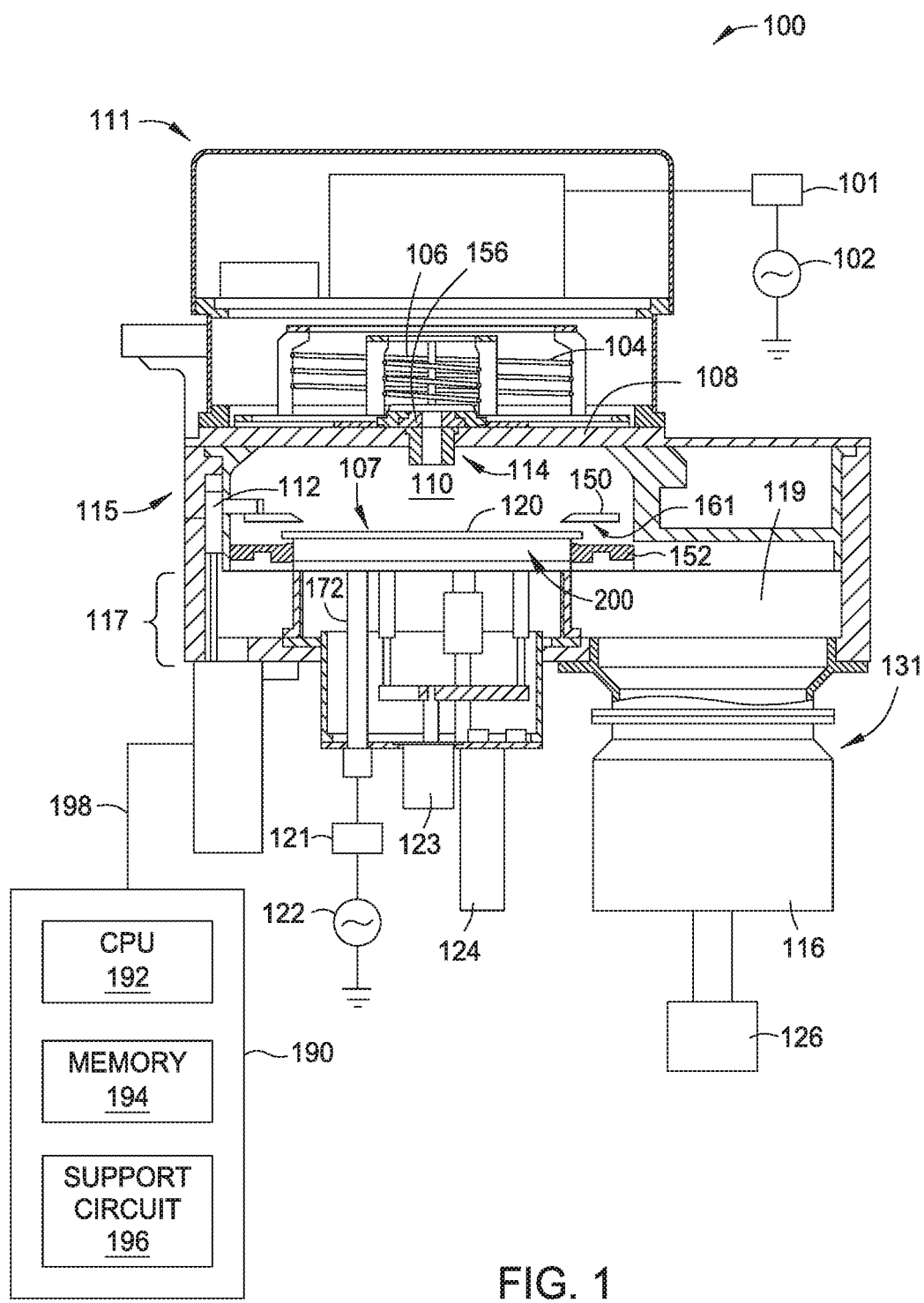
FIG. 1 depicts a side schematic view of a processing chamber according to one implementation of the present disclosure.

It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures.

DETAILED DESCRIPTION

An improved substrate support assembly having a high temperature electrostatic chuck (HT ESC) for processing a substrate at high temperatures, such as greater than 300 degrees Celsius, is disclosed herein. The HT ESC has a ceramic body having a workpiece mounting surface and a bottom surface, a mesh in the form of crossing wires embedded in the ceramic body, and an electrode connected to the mesh. A portion of the electrode is embedded in the ceramic body and contacts the mesh to deliver a bias voltage to the mesh, and a portion of the electrode extends outwardly of the bottom surface of the ceramic body to allow an electrical connector to attach thereto. When a substrate is disposed on the workpiece mounting surface of the ceramic body, the mesh is powered to cause a charge having a first polarity on the workpiece mounting surface of the ceramic body and a charge having a second polarity opposite the first polarity on a surface of the substrate facing the workpiece mounting surface, causing the substrate to electrostatically adhere to the workpiece mounting surface.

In a known, i.e., conventional, ESC, the electrode contacts the mesh immediately below a gas cooling channel of the conventional ESC, resulting in a thin portion of the ceramic body being present between a base of the channel and the electrode (and thus between the mesh on the electrode and the base of the channel). In adjacent regions, the ceramic body is thicker. During thermal cycling of the conventional ESC between room temperature when the system is not in use, and at elevated process temperatures, the conventional ESC expands and contracts, and the weakest portion of the conventional ESC is the thin portion between the electrode (mesh) and the base of the channel. Additionally, a side force applied to the portion of the electrode extending from the bottom surface of the ceramic body is transmitted to the mesh-electrode interface, just below the thin portion of the ceramic body. These physical realities have led to cracking of the thin portion of the ceramic body between the electrode and the base of the channel.

In the solution discussed below, the inner radial channels of the HT ESC are located so that the terminal connection between the electrode and the mesh is not immediately below the inner radial channels. The thickness of the ceramic between the inner radial channels and the electrode is thus doubled compared to the conventional ESC, reducing the stress concentration and thus stopping the cracking. Although the discussion is primarily centered on altering an existing ESC by rotating the inner radial channels, it should be appreciated that a new chuck can center the electrode connection between adjacent channels, and space it as far away as possible while having the inner channels aligned with the outer radial channels.

The HT ESC has a workpiece mounting surface configured to minimize cracking due to processing temperatures exceeding about 300 degrees Celsius. The HT ESC has a ceramic body. Backside gas channels, or grooves, are formed into a workpiece mounting surface of the ceramic body. The backside gas channels can be both radially aligned and also circular. A high voltage chucking mesh, to which the chucking voltage is applied, is disposed inside the ceramic body and has an electrode mounting portion. An electrode is coupled to the electrode mounting portion. The electrode extends out of a bottom surface of the ceramic body. The backside gas channels are positioned to prevent a channel from overlying the area having the electrode. Additionally, the distance between the electrode mounting portion of the mesh and the channels is increased to increase a thickness of the portion of the ceramic body between the electrode mounting portion and the channels. This yields a localized depression in the mesh, i.e., a "dimpled" mesh, which allows the HT ESC to maintain HT ESC's chucking behavior despite portions of the mesh being located further inward of the workpiece mounting surface of the HT ESC. Additionally, the diameter of the electrode mounting portion that is embedded in the ceramic body is decreased to minimize the effect of the mismatch of thermal expansion rates of the ceramic body and the electrode mounting portion.

FIG. 1 depicts a side schematic view of a processing chamber 100 according to one implementation of the present disclosure. The processing chamber 100 may be a plasma processing chamber, such as an inductively coupled plasma (ICP) processing chamber, a decoupled plasma nitridation high dose (DPN HD) processing chamber, or other processing chamber. The processing chamber 100 may be a fully automated semiconductor plasma processing chamber of the kind which is employed as part of a multi-chamber modular system (not shown). As shown in FIG. 1, the processing chamber 100 includes a body 115, a lid 108, and a substrate support assembly 107 disposed within the body 115. A substrate entry port 112 is formed in the body 115 to facilitate entry and removal of a substrate 120 from the processing chamber 100. The body 115, the lid 108 and the substrate support assembly 107 substantially define a processing volume 110. The processing volume 110 may be configured to accommodate the substrate 120 having a nominal diameter size up to 12 inch (300 mm), 18 inch (450 mm), or other diameter.

The processing chamber 100 includes a plasma power source 102 and a matching network 101. The plasma power source 102 and the matching network 101 are in communication with inductive coils 104, 106. The inductive coils 104, 106 is housed within an enclosure 111 disposed on the body 115. The plasma power source 102 and matching network 101 operate at a frequency which is typically in the range of about 12 MHz to about 13.5 MHz. The plasma power source 102 may be operated at a frequency up to 60 MHz. In various implementations, the plasma power source 102 may be operated at an output power in the range from about 0.1 kW to about 5 kW. When energized by the plasma power source 102, the inductive coils 104, 106 generate an RF field in the processing volume 110 that can form a plasma from a gas in the processing volume 110. The plasma can then be used to perform a plasma process on the substrate 120.

The lid 108 may be a plate having a central opening adapted to receive a gas coupling insert 114. The gas coupling insert 114 includes a cylindrical hollow body having a plurality of axial through holes formed in the bottom of the cylindrical hollow body. A gas connector 156 is disposed on the lid 108. A processing gas (not shown) is introduced into the gas connector 156 to through holes of the gas coupling insert 114, which provide uniform controlled gas flow distribution in the processing volume 110.

The processing volume 110 within the body 115 is in fluid communication with a non-processing volume 117. The non-processing volume 117 is in fluid communication with a throttle valve 119. The throttle valve 119 communicates with an exhaust system 131 that includes a turbo pump 116 and a roughing pump 126, all in fluid communication with the throttle valve 119. Exhaust gases flow from the throttle valve 119 sequentially through the turbo pump 116 and the roughing pump 126. In operation, gas is provided to the processing volume 110 and by-products of a reaction of the gas and substrate 120 are exhausted from the processing volume 110 through the throttle valve 119 and the exhaust system 131. The substrate support assembly 107 includes a HT ESC 200. A fluid conduit 124 is coupled to the substrate support assembly 107 to controllably maintain the temperature thereof in a desired range. The HT ESC 200 is operable at temperatures exceeding about 200 degrees Celsius. For example, the temperature set point for the HT ESC 200 is 450 degrees Celsius.

The substrate support assembly 107 has a lift pin assembly 123. The lift pin assembly 123 is operable to move lift pins (unnumbered) generally in a vertical direction. The substrate 120 disposed on the HT ESC 200 is raised and lowered by means of the lift pins to facilitate transfer of the substrate 120 onto and off of the HT ESC 200.

The HT ESC 200 is disposed within the processing volume 110 of the body 115 and is configured to support the substrate 120 during processing. At least a portion of the HT ESC 200 is electrically conductive and capable of biasing a substrate 120 to hold (i.e., chuck) the substrate 120 during processing. The substrate 120 is biased to the HT ESC 200 by providing RF power from a RF bias power source 122 through a matching network 121 and an electrode 172 to a chucking mesh (shown as item 310 in FIG. 3) in the HT ESC 200. RF power provided by the RF bias power source 122 may be within the frequency range of 100 kHz to 13.56 MHz, such as within the range of 100 kHz to 2 MHz. The plasma power source 102 and the RF bias power source 122 for biasing the substrate 120 are independently controlled by the controller 190.

A shadow ring 150 is disposed adjacent to an edge ring 152 circumscribing a periphery region of the HT ESC 200. The edge ring 152 is shaped in a manner to define a cavity 161 between the edge ring 152 and the shadow ring 150. The cavity 161 defines a constrained flow path that allows process gas to flow in a direction away from substrate bevel and be pumped out of the processing chamber 100 through the cavity 161 to the roughing pump 126, rather than accumulating and forming a residual film layer on the substrate bevel or backside.

The processing chamber 100 has a controller 190. The controller 190 controls the operations of the plasma power source 102 and matching network 101, the processing gas, the roughing pump 126, the RF bias power, and other chamber operations. The controller 190 includes a central processing unit (CPU) 192, a memory 194, and a support circuit 196 utilized to control the process sequence and regulate the gas flows and plasma process performed in the processing chamber 100. The CPU 192 is of any form of a general purpose computer processor that may be used in an industrial setting. The software routines such as the etching process described below can be stored in the memory 194, such as random access memory, read only memory, floppy, or hard disk drive, or other form of digital storage. The support circuit 196 is conventionally coupled to the CPU 192 and may include cache, clock circuits, input/output systems, power supplies, and the like. Bi-directional communications between the controller 190 and the various components of the processing chamber 100 are handled through numerous signal cables collectively referred to as signal buses 198, some of which are illustrated in FIG. 1.

During processing of substrate 120 in the processing chamber 100, the HT ESC 200 is held at temperatures in excess of 300 degrees Celsius, such as 450 degrees Celsius. The HT ESC 200 disclosed herein is configured to chuck the substrate 120 during high temperature substrate processing without cracking or damaging the HT ESC 200.

Figure 2:
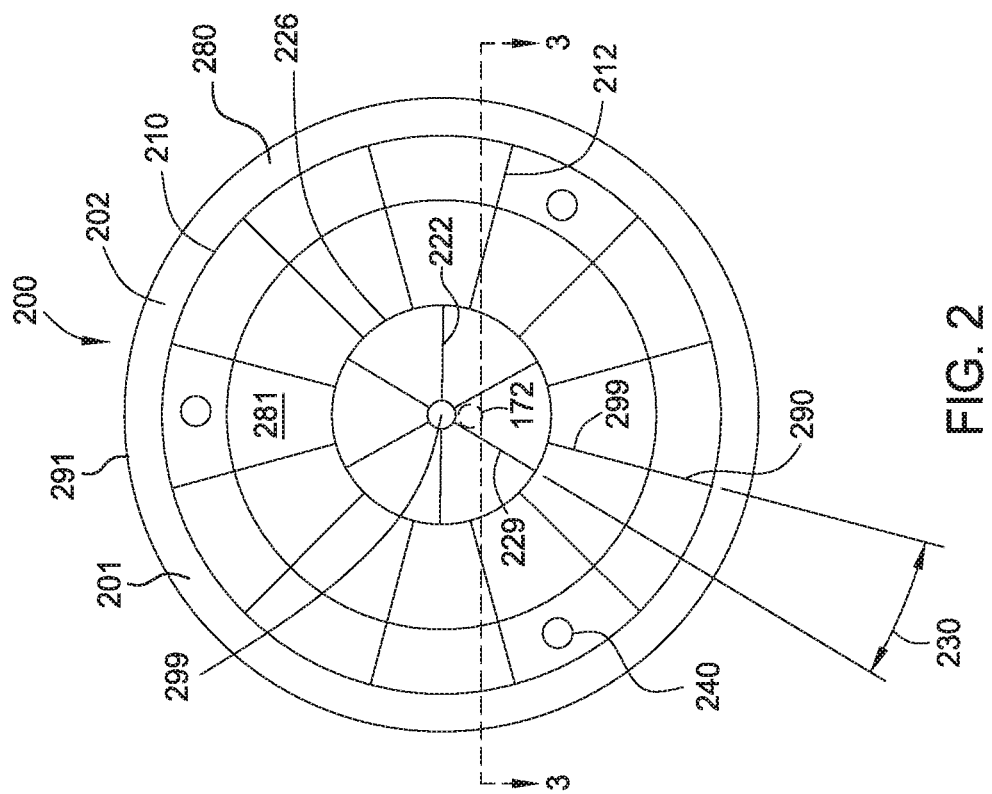
FIG. 2 depicts a top schematic view of an ESC according to one implementation of the present disclosure.

FIG. 2 depicts a top schematic view of the HT ESC 200 according to one implementation of the present disclosure. The HT ESC 200 has a ceramic body 201. The ceramic body 201 being a dielectric material, i.e., a very poor conductor of electric current. The ceramic body 201 has a workpiece support surface 202, a bottom surface 302 (shown in FIG. 3) opposite the workpiece support surface 202, a centerline 299 extending from the workpiece support surface 202 to the bottom surface 302, and an outer periphery 291. The ceramic body 201 additionally has a plurality of back side gas channels, such as circular channels 226, 210 and radial channels 290, formed in the workpiece support surface 202. The ceramic body 201 also has lift pin holes 240 formed through the ceramic body 201. The ceramic body 201 has one or more temperature control devices, such as heaters, disposed therein (shown as item 308 in FIG. 3). The ceramic body 201 has one or more chucking meshes disposed therein (shown as a chucking mesh 310 in FIG. 3). The chucking mesh 310 is sandwiched between ceramic sheets which are then sintered together to form the ceramic body 201 of the HT ESC 200.

The electrode 172 (shown in dotted lines) is coupled to the chucking mesh 310 (FIG. 3) below the workpiece support surface 202 of the HT ESC 200. In use, the electrode 172 is accessible from the bottom surface 302 of the HT ESC 200. The electrode 172 is coupled to a power source, such as RF bias power source 122, for biasing, i.e., chucking, a substrate to the workpiece support surface 202.

The HT ESC 200 additionally has a plurality of pads 281, formed by the radial channels 290, i.e., between the radial channels 290. The HT ESC 200 additionally has a sealing band 280 extending axially from the workpiece support surface 202. The sealing band 280 extends above the plane of the pads 281. A substrate supported on the HT ESC 200 rests on the sealing band 280 and upon being chucked, additionally contacts the pads 281.

The first circular channel 226 is a ring shaped gas channel in the workpiece support surface 202 centered about the centerline 299. The second circular channel 210 is a second ring shaped gas channel in the workpiece support surface 202 outward of, and concentric to, the first circular channel 226. The first circular channel 226 and the second circular channel 210 are fluidly coupled to the radial channels 290. The ceramic body 201 has an inner area 222 defined between the centerline 299 and the first circular channel 226. The ceramic body 201 also has an outer area 212 defined between the first circular channel 226 and the second circular channel 210.

The radial channels 290 each have an inner portion 229 disposed in the inner area 222 of the ceramic body 201. The radial channels 290 also have an outer portion 239 extending radially from the first circular channel 226 to the second circular channel 210. The inner portion 229 of the radial channels 290 extending radially from the centerline 299 to the first circular channel 226. In one embodiment, the inner portion 229 of the each radial channel 290 is misaligned, or offset, from a corresponding outer portion 239, as shown in FIG. 2. For example, the inner portion 229 of the radial channels 290 are rotated an angle 230 between about 10 degrees and about 30 degrees, such as about 20 degrees from the outer portion 239 of the radial channels 290. In another embodiment, the outer portion 239 of the each radial channel 290 is radially aligned with a corresponding inner portion 229. A plurality of gas feed holes (not shown) extend through the ceramic body 201 of the HT ESC 200. The gas feed holes are configured to provide a cooling gas into the radial channels 290 along a backside of the substrate when the substrate is chucked to the HT ESC 200.

The electrode 172 of the HT ESC 200 is disposed below the inner area 222 of the ceramic body 201. An imaginary line extending through the electrode 172 to the workpiece support surface 202 does not transect any of the radial channels 290 or circular channels 226, 210.

Figure 3:
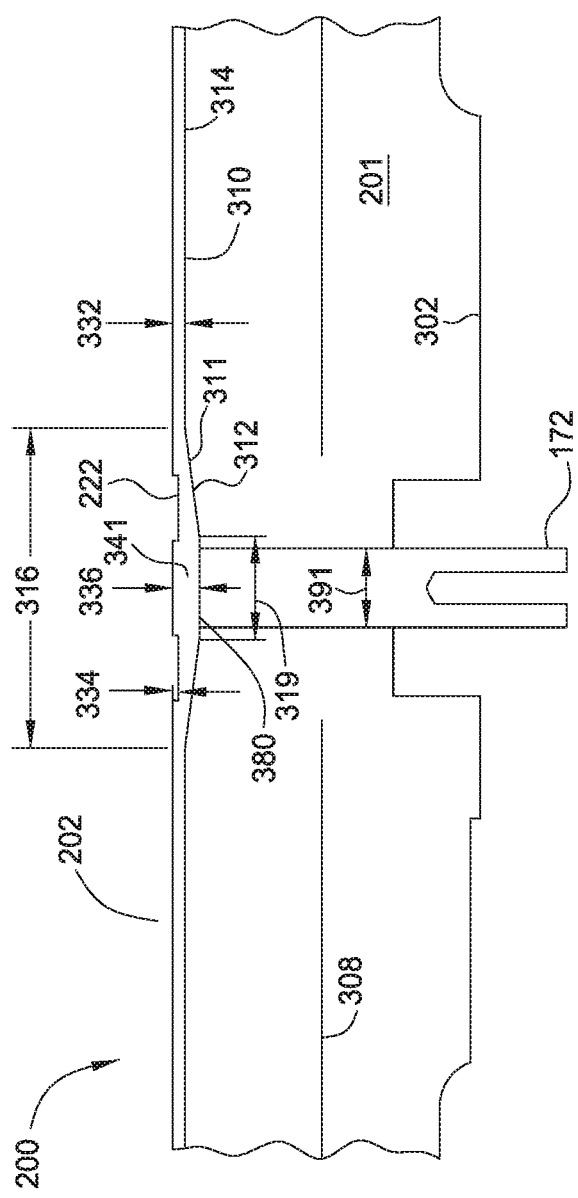
FIG. 3 depicts a partial cross-sectional schematic view of the ESC of FIG. 2 taken along line 3-3.

FIG. 3 depicts a partial schematic cross-sectional view of the HT ESC 200 of FIG. 2 taken along line 3-3.

The electrode 172 is electrically coupled to the chucking mesh 310 at the electrode mounting surface 380 disposed in the ceramic body 201 of the HT ESC 200. The chucking mesh 310 is substantially parallel to and proximate the workpiece support surface 202. The chucking mesh 310 has a mounting portion 312 and a main chucking portion 314. A substantial portion of the chucking mesh 310 is in the main chucking portion 314. That is, the surface area of the main chucking portion 314 is significantly larger than the surface area of the mounting portion 312. For example, the surface area of the main chucking portion 314 forms greater than 90% of the surface area of the chucking mesh 310. The mounting portion 312 of the chucking mesh 310 is dished, indented, recessed, or curved away from the workpiece support surface 202. In one embodiment, the mounting portion 312 is a dimple. For example, the mesh may be pressed over a mandrel or mold to form the dimple. Alternately, the dimple may be formed in an additive manufacturing technique such as 3D printing.

The electrode mounting surface 380 for the electrode 172 is disposed in the mounting portion 312 of the chucking mesh 310, for example wholly disposed therein. The electrode mounting surface 380 is substantially flat to facilitate coupling to the electrode 172. The electrode mounting surface 380 is also substantially parallel to the workpiece support surface 202.

The electrode mounting portion 312 has a first area 316. The electrode mounting surface 380 has a mounting area 319. The first area 316 is between about 3 and about 5 times larger than the mounting area 319, such as about four times larger than the mounting area 319. The electrode 172 has an electrode cross-sectional width 391. Here, the electrode cross-sectional width 391 has been reduced compared to that of conventional electrodes to minimize the effect of thermal expansion of the electrode in the ceramic body having a low thermal expansion. In one embodiment, the electrode cross-sectional width 391 is between 3 mm and about 7 mm, such as about 6 mm. The mounting area 319 of the electrode mounting surface 380 is at least the same size or larger than the electrode cross-sectional width 391 of the electrode 172.

The main chucking portion 314 of the chucking mesh 310 is disposed a first distance 332 from the workpiece support surface 202. The electrode mounting surface 380 of the chucking mesh 310 is disposed a second distance 336 from the workpiece support surface 202. The second distance 336 is greater than the first distance 332. Thus, a material 341 of the ceramic body 201 disposed above the electrode 172 is thicker along the second distance 336. The second distance 336 at the electrode mounting surface 380 has a material thickness of between about 0.5 mm and about 1.5 mm thicker than the material thickness of the first distance 332 along the main chucking portion 314. In one embodiment, the second distance 336 is about 1 mm longer than the first distance 332. The remaining portion of the mounting portion 312, such as a slanted portion 311 connecting the electrode mounting surface 380 and the main chucking portion 314, is also further away from the workpiece support surface 202 than the main chucking portion 314. Thus, the distance between any portions of the mounting portion 312 is greater than the first distance 332.

The electrode 172 is also not vertically aligned with the radial channels 290. That is, the electrode 172 is substantially perpendicular to the workpiece support surface 202 and offset from the locations of the plurality of radial channels 290. For example, an imaginary line extending the electrode 172 perpendicularly to the workpiece support surface 202 does not transect any of the plurality of radial channels 290. The radial channels 290 are formed into the ceramic body 201 a depth 334 of between about 0.010 inches and about 0.020 inches. By offsetting the position of the electrode 172 with respect to the positions of the radial channels 290, through rotation or other techniques which ensure the electrode 172 is not disposed perpendicularly below the radial channels 290, the thickness of material above the electrode 172, i.e., the second distance 336, can be further enlarged since the depth 334 of the radial channels 290 would not extend into the second distance 336. The electrode 172 is also not vertically aligned with the circular channels 260, 210.

Figure 4:
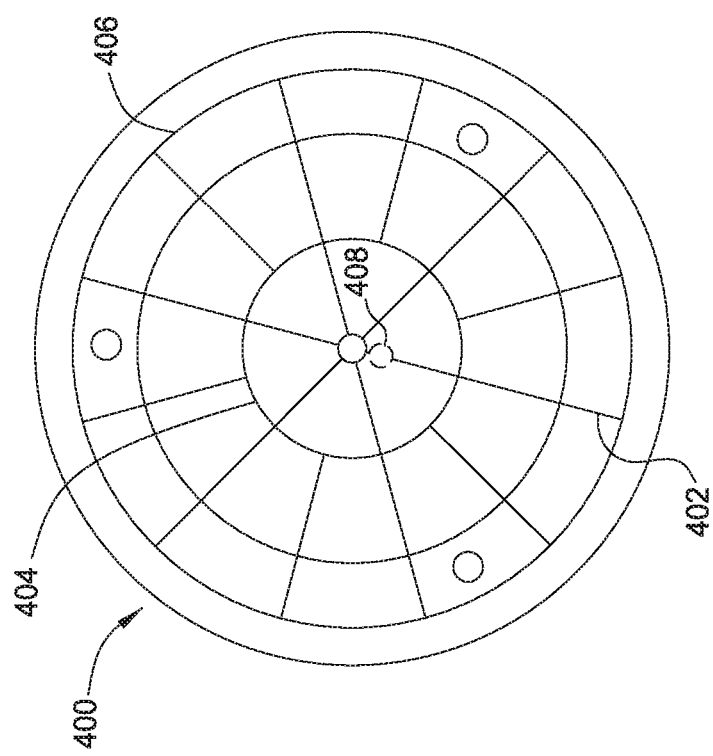
FIG. 4 depicts a top schematic view of a conventional ESC.

FIG. 4 depicts a top schematic view of a conventional ESC 400. The conventional ESC 400 includes a plurality of backside gas channels, such as radial channels 402 and circular channels 404, 406. At least a portion of an electrode 408 is embedded in the conventional ESC 400. The electrode 408 is aligned with at least one of the backside channels, such as a radial channel 402, as shown in FIG. 4. Because the electrode 408 is aligned with a radial channel 402, the portion of the ceramic body of the conventional ESC 400 present between a base of the radial channel 402 and the electrode 408 is thinner than the portion of the ceramic body adjacent the electrode 408. The thin portion of the ceramic body between the base of the radial channel 402 and the electrode 408 is susceptible to cracking during thermal cycling of the conventional ESC between room temperature when the system is not in use, and at elevated process temperatures.

Advantageously, implementations of the present disclosure provide an improved HT ESC for use in semiconductor processing systems. The HT ESC has a ceramic body. The workpiece mounting surface of the ceramic body has channels for the backside gas. In a conventional ESC, the material thickness of the ceramic body between the backside gas channels and the high voltage chuck mesh is thinner, and those portions of the ceramic body are weaker. In the embodiments described above, the backside gas channels do not overlie the electrode to avoid cracking of the ceramic body at high temperatures where the thermal expansion of the ceramic body occurs. Also, the dimple in the electrode is lowered from the workpiece mounting surface, which adds material thickness to the HT ESC above the mesh, strengthening that region of the HT ESC otherwise prone to cracking. This enables a "dimpled" mesh, a localized depression, which allows the HT ESC to have additional strength in this area while maintaining the chucking behavior of the HT ESC. The HT ESC assembly of the present disclosure also includes clearances that ensure electrical connectors do not experience any mechanical interference. Also, the HT ESC includes an electrode with portions embedded in the ceramic having a reduced diameter in order to reduce the effects of the mismatch in thermal expansion rates of the two different materials. The HT ESC of the present disclosure is more resistant to cracking at high temperatures, such as temperature set points held at 450° C., than conventional high temperature electrostatic chucks. In experiments, the HT ESC was cycled more than 90 times with no signs of failure/cracking.

While the foregoing is directed to implementations of the present disclosure, other and further implementations of the disclosure may be devised without departing from the basic scope thereof, and the scope thereof is determined by the claims that follow.

What is claimed is:
1. A high temperature electrostatic chuck (ESC), comprising:
   a ceramic body having a workpiece mounting surface and a bottom surface;
   a plurality of backside gas channels formed on the workpiece mounting surface and does not penetrate the bottom surface; and
   a chucking mesh disposed in the ceramic body, the chucking mesh comprising:

a main chucking portion spaced directly under the workpiece mounting surface a first distance within the ceramic body; and an electrode mounting portion spaced directly under the workpiece mounting surface a second distance within the ceramic body, the second distance being greater than the first distance, the main chucking portion and the electrode mounting portion formed from a single mesh of material; and a top of an electrode coupled to the electrode mounting portion, wherein a bottom of the electrode is accessible from the bottom surface, wherein the electrode is misaligned with the plurality of backside gas channels, and wherein a first thickness of dielectric material is defined between the top of the electrode and the workpiece mounting surface, the first thickness of dielectric material across the top of the of the electrode is uniform and the first thickness is always greater than a second thickness of dielectric material defined between the mesh and a bottom of the backside gas channel formed in the workpiece mounting surface of the ESC.

2. The high temperature electrostatic chuck of claim 1, wherein the second distance is between about 0.5 mm and about 1.5 mm greater than the first distance.

3. The high temperature electrostatic chuck of claim 2, wherein the second distance is about 1.0 mm greater than the first distance.

4. The high temperature electrostatic chuck of claim 2, wherein the electrode mounting portion has a mesh area greater than a cross sectional area of the electrode.

5. The high temperature electrostatic chuck of claim 1, wherein the high temperature electrostatic chuck is operable at temperatures exceeding about 300 degrees Celsius.

6. The high temperature electrostatic chuck of claim 1, wherein the electrode mounting portion of the chucking mesh is dished, indented, recessed, curved or dimpled.

7. The high temperature electrostatic chuck of claim 1, wherein the plurality of backside gas channels further comprises:
    a first circular channel defining an inner area of the workpiece mounting surface; and
    a second circular channel surrounding the first circular channel.

8. The high temperature electrostatic chuck of claim 7, wherein the electrode is disposed below the inner area of the workpiece mounting surface, and a line extending through the electrode to the workpiece mounting surface does not transect any of the plurality of backside gas channels.

9. A processing chamber, comprising:
a body;
a substrate support assembly disposed within the body, the substrate support assembly having high temperature electrostatic chuck (ESC), the high temperature electrostatic chuck comprising:
    a ceramic body having a workpiece mounting surface and a bottom surface; largely
    a plurality of channels formed on the workpiece mounting surface and does not penetrate the bottom surface; and
    a chucking mesh disposed in the ceramic body proximate the workpiece mounting surface, the chucking mesh comprising:
        a main chucking portion spaced directly under the workpiece mounting surface a first distance within the ceramic body; and
        an electrode mounting portion spaced directly under the workpiece mounting surface a second distance within the ceramic body, the second distance being greater than the first distance, the main chucking portion and the electrode mounting portion formed from a single mesh of material; and
    a top of an electrode coupled to the electrode mounting portion, wherein a bottom of the electrode extends out from the bottom surface and the top of the electrode is misaligned with the plurality of channels, wherein a first thickness of dielectric material is defined between the top of the electrode and the workpiece mounting surface, the first thickness of dielectric material across the top of the of the electrode is uniform and the first thickness is always greater than a second thickness of dielectric material defined between the mesh and a bottom of the channels formed in the workpiece mounting surface of the ESC.

10. The processing chamber of claim 9, wherein the second distance is between about 0.5 mm and about 1.5 mm greater than the first distance.

11. The processing chamber of claim 10, wherein the second distance is about 1.0 mm greater than the first distance.

12. The processing chamber of claim 9, wherein the high temperature electrostatic chuck is operable at temperatures exceeding about 300 degrees Celsius.

13. The processing chamber of claim 9, wherein the electrode mounting portion of the chucking mesh is dished, indented, recessed, curved or dimpled.

14. The processing chamber of claim 9, the plurality of backside gas channels further comprises:
    a first circular channel defining an inner area of the workpiece mounting surface; and
    a second circular channel surrounding the first circular channel.

15. The processing chamber of claim 14, wherein the electrode is disposed below the inner area of the workpiece mounting surface, and a line extending through the electrode to the workpiece mounting surface does not transect any of the plurality of backside gas channels.

16. A method for forming a high temperature electrostatic chuck (HT ESC), the method comprising:
    sandwiching a chucking mesh between ceramic sheets which are then sintered together to form a ceramic body of the HT ESC;
    forming a dimple in the chucking mesh;
    attaching a top of an electrode to the dimple, the electrode being accessible from a bottom surface of the HT ESC; and
    forming backside gas channels in a workpiece support surface of the HT ESC, the backside gas channels being misaligned with the electrode, wherein a first thickness of dielectric material is defined between the top of the electrode and the workpiece mounting surface, the first thickness of dielectric material across the top of the of the electrode is uniform and the first thickness is always greater than a second thickness of dielectric material defined between the mesh and a bottom of the backside gas channels formed in the workpiece mounting surface of the HT ESC.

17. The method of claim 16, wherein a first distance from a location of the dimple contacting the electrode to the workpiece mounting surface is between about 0.5 mm and about 1.5 mm greater than a second distance from a main chucking portion of the chucking mesh to the workpiece mounting surface.

18. The method of claim 16, wherein the HT ESC is operable at temperatures exceeding about 450 degrees Celsius.

\* \* \* \* \*